(12) United States Patent
Jeong (10) Patent No.: US 10,290,691 B2
(45) Date of Patent: May 14, 2019

(54) ORGANIC LIGHT EMITTING DISPLAY PANEL AND ORGANIC LIGHT EMITTING DISPLAY DEVICE

(71) Applicant: LG DISPLAY CO., LTD., Seoul (KR)

(72) Inventor: Haeyeon Jeong, Osan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 18 days.

(21) Appl. No.: 15/394,125

(22) Filed: Dec. 29, 2016

(65) Prior Publication Data

US 2017/0194409 A1    Jul. 6, 2017

(30) Foreign Application Priority Data

Dec. 31, 2015    (KR) ........................ 10-2015-0191123

(51) Int. Cl.
*H01L 27/32*    (2006.01)
*H01L 27/12*    (2006.01)
*H01L 51/00*    (2006.01)

(52) U.S. Cl.
CPC ...... *H01L 27/3262* (2013.01); *H01L 27/1218* (2013.01); *H01L 27/1255* (2013.01); *H01L 27/3248* (2013.01); *H01L 27/3265* (2013.01); *H01L 51/0097* (2013.01); *H01L 2251/5338* (2013.01); *Y02E 10/549* (2013.01)

(58) Field of Classification Search
CPC ............. H01L 51/0097; H01L 27/3244; H01L 27/3276; H01L 51/5203; H01L 51/56; H01L 2227/323; H01L 2251/5338; H01L 2251/5392; H01L 27/3262; H01L 27/3265; H01L 27/3248; H01L 27/1218; H01L 27/124; H01L 27/3246; H01L 27/3272; C09K 11/06; G09G 3/3291; G09G 3/3225; G09G 2300/0426; G09G 2380/02
See application file for complete search history.

(56) References Cited

U.S. PATENT DOCUMENTS

| | | | | |
|---|---|---|---|---|
| 8,288,938 B2* | 10/2012 | Kim | ...................... | G09G 3/3208 313/504 |
| 9,564,477 B2* | 2/2017 | Kim | ...................... | H01L 27/3218 |
| 9,608,216 B2* | 3/2017 | Cheon | ................. | H01L 51/0097 |
| 2009/0219225 A1* | 9/2009 | Cope | ......................... | G09F 9/30 345/55 |

(Continued)

FOREIGN PATENT DOCUMENTS

KR    10-2014-0114201 A    9/2014

*Primary Examiner* — Roy K Potter
(74) *Attorney, Agent, or Firm* — Dentons US LLP (57) ABSTRACT

Provided are an organic light emitting display panel and an organic light emitting display device. The organic light emitting display panel includes: an organic light emitting display panel. The organic light emitting display panel may include: a flexible substrate including a first non-bending area, a second non-bending area and a bending area between the first non-bending area and the second non-bending area; a plurality of organic light emitting elements disposed in the first non-bending area, the second non-bending area and the bending area; and a plurality of pixel driving circuits electrically connected to the plurality of organic light emitting elements, respectively, and disposed only in the first non-bending area and the second non-bending area. The organic light emitting element may include an anode, an organic emission layer, and a cathode.

15 Claims, 7 Drawing Sheets

(56) References Cited

U.S. PATENT DOCUMENTS

2013/0342429 A1* 12/2013 Choi .................. H05K 13/00
                                                    345/30
2014/0361262 A1   12/2014 Kim
2015/0115253 A1    4/2015 Ha et al.

* cited by examiner

ORGANIC LIGHT EMITTING DISPLAY PANEL AND ORGANIC LIGHT EMITTING DISPLAY DEVICE

CROSS-REFERENCE TO RELATED APPLICATIONS

This application claims priority from Korean Patent Application No. 10-2015-0191123 filed on Dec. 31, 2015, the disclosure of which is incorporated by reference as if fully set forth herein.

BACKGROUND

Technical Field

The present disclosure relates to an organic light emitting display panel and an organic light emitting display device, including an organic light emitting display panel and an organic light emitting display device which can reduce or minimize deterioration of the characteristics of the driving elements during repeated bending.

Description of the Related Art

An organic light emitting display device is a self-light emitting display device and does not need a separate light source unlike a liquid crystal display device (LCD). Thus, the organic light emitting display device can be manufactured in a lightweight and thin form. Further, the organic light emitting display device is advantageous in terms of power consumption since it is driven with a low voltage. Also, the organic light emitting display device has excellent color expression ability, a high response speed, a wide color viewing angle, and a high contrast ratio. Therefore, the organic light emitting display device has been researched as a next-generation display device.

In recent years, flexible display devices, which are capable of displaying an image even when bent like paper by including a line on a substrate formed of a flexible material such as plastic, have received attention as next-generation display devices. Flexible display devices have been widely used in a variety of applications spanning from monitors of computers and televisions (TVs) to personal portable equipment. There has also been interest in developing flexible display devices having a large display area and a smaller volume and weight. Especially, there has been increasing interest in organic light emitting display devices as being more suitable for a flexible display device, because such devices do not need a backlight unit, unlike liquid crystal display devices.

An organic light emitting display device as a flexible display device can be configured to be bent or folded only in one direction and only in a specific area. If the organic light emitting display device is implemented as a bendable or foldable display device as described above, the specific area may be repeatedly bent, thereby damaging or deteriorating the driving elements disposed in the corresponding area.

SUMMARY

An exemplary objective of the present disclosure is to provide an organic light emitting display panel and an organic light emitting display device in which a pixel driving circuit for driving an organic light emitting element is not disposed in a bending area subject to repeated bending, thereby reducing or minimizing damage to a pixel driving circuit caused by the stress generated during repeated bending.

Another exemplary objective of the present disclosure is to provide an organic light emitting display panel and an organic light emitting display device in which a pixel driving circuit and a gate driving circuit are disposed in a non-bending area, thereby improving reliability.

The objectives of the present disclosure are not limited to the aforementioned exemplary objectives, and other objectives not mentioned above will be apparent to a person having ordinary skill in the art from the following description.

In an exemplary embodiment, the present disclosure provides an organic light emitting display panel comprising: a flexible substrate including a first non-bending area, a second non-bending area and a bending area between the first non-bending area and the second non-bending area; a plurality of organic light emitting elements disposed in the first non-bending area, the second non-bending area and the bending area, wherein the plurality of organic light emitting elements include an anode, an organic emission layer, and a cathode; and a plurality of pixel driving circuits in the first non-bending area and the second non-bending area, wherein the plurality of pixel driving circuits are electrically connected to the plurality of organic light emitting elements.

In another exemplary embodiment, the flexible substrate includes an active area and a bezel area surrounding the active area, and the active area includes the plurality of organic light emitting elements and the plurality of pixel driving circuits.

In another exemplary embodiment, each of the plurality of pixel driving circuits includes a switching thin film transistor, a capacitor and a driving thin film transistor electrically connected to the organic light emitting element.

In another exemplary embodiment, the organic light emitting display panel, further comprises: a gate driving circuit in the bezel area, wherein the gate driving circuit includes a thin film transistor and a capacitor.

In another exemplary embodiment, the thin film transistor and the capacitor of the gate driving circuit are disposed in the first non-bending area and the second non-bending area overlapping with the active area.

In another exemplary embodiment, the organic light emitting display panel further comprises: a plurality of gate lines connecting the gate driving circuit and the plurality of pixel driving circuits, wherein the plurality of gate lines is disposed in the first non-bending area and the second non-bending area.

In another exemplary embodiment, the number of the organic light emitting elements in the first non-bending area and the second non-bending area is smaller than the number of the pixel driving circuits in the first non-bending area and the second non-bending area.

In another exemplary embodiment, the number of the pixel driving circuits per unit area in the first non-bending area and the number of the pixel driving circuits per unit area in the second non-bending area decreases as a distance from the bending area increases.

In another exemplary embodiment, the organic light emitting display panel further comprises: a connection line connecting the anode of the organic light emitting element in the bending area and the pixel driving circuit in the first non-bending area or the second non-bending area, wherein the connection line comprises a material, which is the same as a material of one of a source electrode, a drain electrode and a gate electrode disposed on the pixel driving circuit.

In another exemplary embodiment, the connection line is an extension of one of the source electrode and the drain electrode.

In another exemplary embodiment, one or more lines and one or more insulation layers are disposed between the flexible substrate and the organic light emitting elements in the bending area.

In another exemplary embodiment, the anode includes a reflective layer comprising a metal material and a transparent conductive layer comprising a transparent conductive material, wherein the transparent conductive layer is on the reflective layer.

Another exemplary embodiment of the present disclosure provides an organic light emitting display device comprising: a case including a first case, a second case, and a bending member connecting the first case and the second case; and an organic light emitting display panel surrounded by the case, and including a plurality of organic light emitting elements and a plurality of pixel driving circuits electrically connected to the plurality of organic light emitting elements, wherein the plurality of pixel driving circuits are disposed in a part of the organic light emitting display panel surrounded by the first case and the second case.

In another exemplary embodiment, the organic light emitting display device according to claim 13, further comprises: a gate driving circuit including a thin film transistor and a capacitor, wherein the thin film transistor and the capacitor are disposed in the part of the organic light emitting display panel surrounded by the first case and the second case.

In another exemplary embodiment, the bending member bends the organic light emitting display device in one direction.

Details of other exemplary embodiments of the present disclosure will be included in the following detailed description and the accompanying drawings.

According to the present disclosure, a pixel driving circuit and a gate driving circuit are disposed in a non-bending area, thereby suppressing deterioration in characteristics of an interface between laminated layers or cracks of a metal layer or an insulation layer caused by repeated bending.

Further, according to the present disclosure, it is possible to minimize a change in threshold voltage (Vth) or mobility of a thin film transistor when stress is applied to the thin film transistor when an organic light emitting display panel is bent.

The effects of the present disclosure are not limited to the aforementioned effects, and various other effects, and their equivalents, are included in the present disclosure.

BRIEF DESCRIPTION OF THE DRAWINGS

The above and other aspects, features and advantages of the present disclosure will be more clearly understood from the following detailed description taken in conjunction with the accompanying drawings, in which.

DETAILED DESCRIPTION OF THE EMBODIMENT

Advantages and features of the present disclosure, and methods for accomplishing the same will be more clearly understood from exemplary embodiments described below with reference to the accompanying drawings. However, the present disclosure is not limited to the following exemplary embodiments and may be implemented in various different forms. The exemplary embodiments are provided only to complete disclosure of the present disclosure and to fully provide a person having ordinary skill in the art to which the present disclosure pertains with the category of the invention, and the present disclosure will be defined by any appended claims and combinations thereof.

Shapes, sizes, ratios, angles, numbers, and the like shown in the accompanying drawings are merely exemplary, and the present disclosure is not limited thereto. Like reference numerals generally denote like elements throughout the present specification. Further, in the following description, a detailed explanation of well-known related technologies may be omitted to avoid unnecessarily obscuring the subject matter of the present disclosure. Terms such as "including," "having," and "consisting of" used herein are generally intended to allow other components to be included unless the terms are used in conjunction with the term "only". Any references to the singular may include the plural unless expressly stated otherwise.

Components are interpreted to include an ordinary error range even if not expressly stated.

When the positional relation between two parts is described using the terms such as "on", "above", "below", and "next", one or more parts may be positioned between the two parts unless the terms are used in conjunction with the term "immediately" or "directly".

When an element or layer is referred to as being "on" another element or layer, the element or layer may be directly on the other element or layer, or intervening elements or layers may be present.

Although the terms "first", "second", and the like are used for describing various components, these components are not confined by these terms. These terms are merely used for distinguishing one component from the other components, and a first component may be a second component in a technical concept of the present disclosure.

The size and thickness of each component illustrated in the drawings are represented for convenience of explanation, and the drawings are not necessarily to scale.

The features of various embodiments of the present disclosure can be partially or entirely bonded to or combined with each other and can be interlocked and operated in various technical ways, and the embodiments can be carried out independently of, or in association with, each other.

Hereinafter, various exemplary embodiments of the present disclosure will be described in detail with reference to the accompanying drawings.

Figure 1:
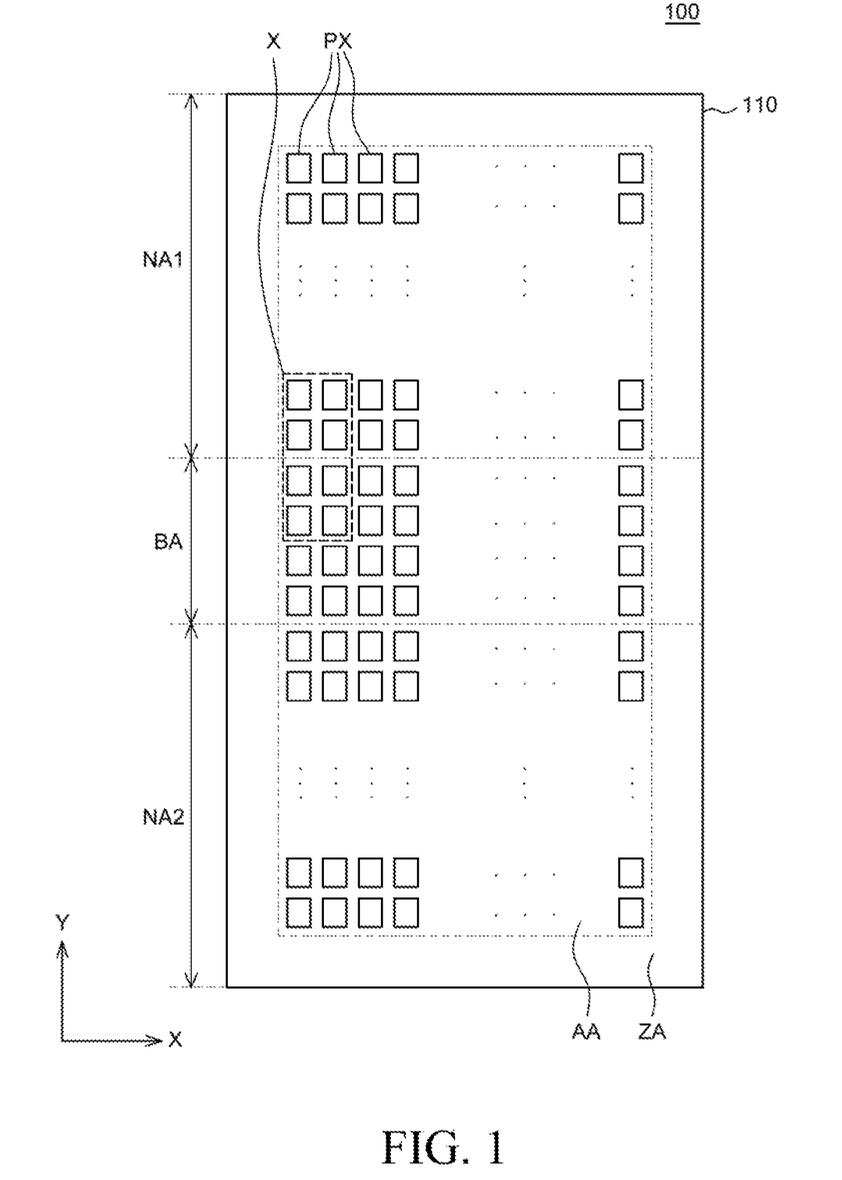
FIG. 1 is a plan view of an organic light emitting display panel according to an exemplary embodiment of the present disclosure.

FIG. 1 is a plan view of an organic light emitting display panel according to an exemplary embodiment of the present disclosure. As illustrated in FIG. 1, an organic light emitting display panel 100 includes a flexible substrate 110 and a plurality of pixels PX.

The flexible substrate 110 supports various elements of the organic light emitting display panel 100, and may be formed of a flexible insulating material. For example, the flexible substrate 110 may be formed of a transparent plastic material such as polyimide (PI) and polyethylene terephthalate (PET), but is not limited thereto.

The flexible substrate 110 includes a first non-bending area NA1, a second non-bending area NA2 and a bending area BA between the first non-bending area NA1 and the second non-bending area NA2.

The organic light emitting display panel 100 may be configured to be bendable in the bending area BA. That is, the first non-bending area NA1 and the second non-bending area NA2 of the flexible substrate 110 are maintained in a flat state without being bent, and only the bending area BA of the flexible substrate 110 can be bent. The organic light emitting display panel 100 may be bent such that the first non-bending area NA1 and the second non-bending area NA2 of the flexible substrate 110 can face each other.

Figure 2:
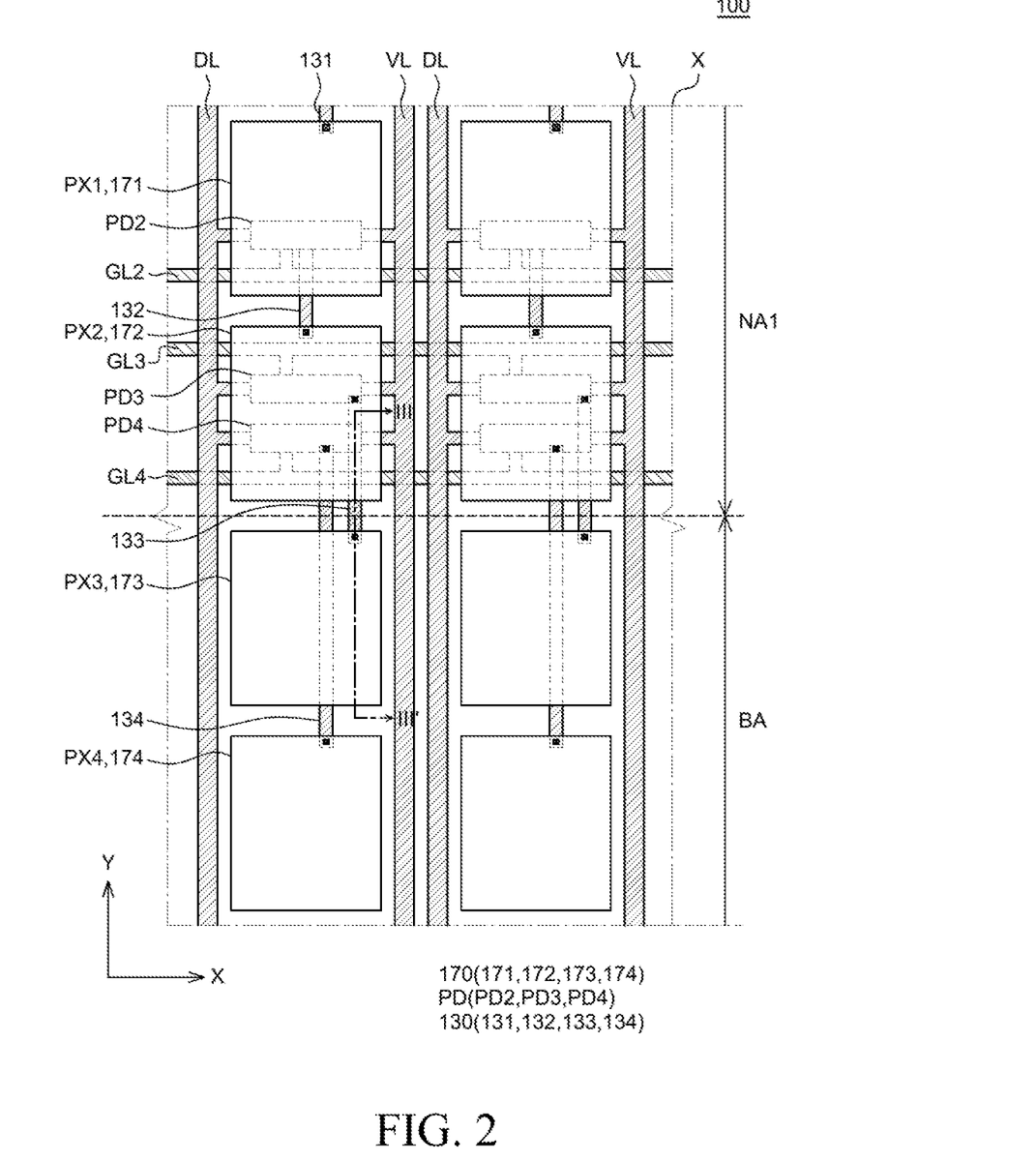
FIG. 2 is an enlarged plan view of an area X of the organic light emitting display panel illustrated in FIG. 1.

The flexible substrate 110 further includes an active area AA and a bezel area ZA surrounding the active area AA. The active area AA is an area where an image is displayed on the organic light emitting display panel 100. As illustrated in FIG. 2, a plurality of organic light emitting elements 170 and a plurality of pixel driving circuits PD electrically connected to the plurality of organic light emitting elements 170, respectively, for driving the plurality of organic light emitting elements 170 are disposed in the active area AA. The bezel area ZA is an area where an image is not displayed on the organic light emitting display panel 100, and various lines or driving circuits except the pixel driving circuits are formed thereon. Although not illustrated in FIG. 1, the bezel area ZA may include a pad area on one side of the bezel area ZA on which an external module is disposed. The pad area of the bezel area ZA is an area where an image is not displayed and a plurality of pad electrodes are formed. In the present disclosure, the pad area is an area where the pad electrodes are bonded to external modules, for example, an FPCB (flexible printed circuit board), a TCP (Tape Carrier Package), and a COF (chip on film).

As illustrated in FIG. 1, the plurality of pixels PX are disposed in the active area AA of the organic light emitting display panel 100 but not disposed in the bezel area ZA. Further, the plurality of pixels PX are disposed in an area overlapping with the active area AA of the first non-bending area NA1, the second non-bending area NA2, and the bending area BA. That is, the plurality of pixels are disposed at a central portion of the organic light emitting display panel 100.

Each of the plurality of pixels PX is an area which can independently display a specific color. For example, the plurality of pixels PX may include a red pixel configured to emit red light, a green pixel configured to emit green light, a blue pixel configured to emit blue light, and a white pixel configured to emit white light, but the present disclosure is not limited thereto. The plurality of pixels PX may also include a pixel configured to emit light of a different color.

One of the plurality of organic light emitting elements is disposed in each of the plurality of pixels PX, and the plurality of organic light emitting elements are electrically connected to the plurality of pixel driving circuits, respectively. Thus, each of the plurality of pixels PX can be defined as having an organic light emitting element and a pixel driving circuit. Hereinafter, the organic light emitting elements 170 and the pixel driving circuits PD of the respective pixels PX disposed in the bending area BA and the non-bending areas NA1 and NA2 will be described in detail with reference to FIGS. 2 and 3.

Figure 3:
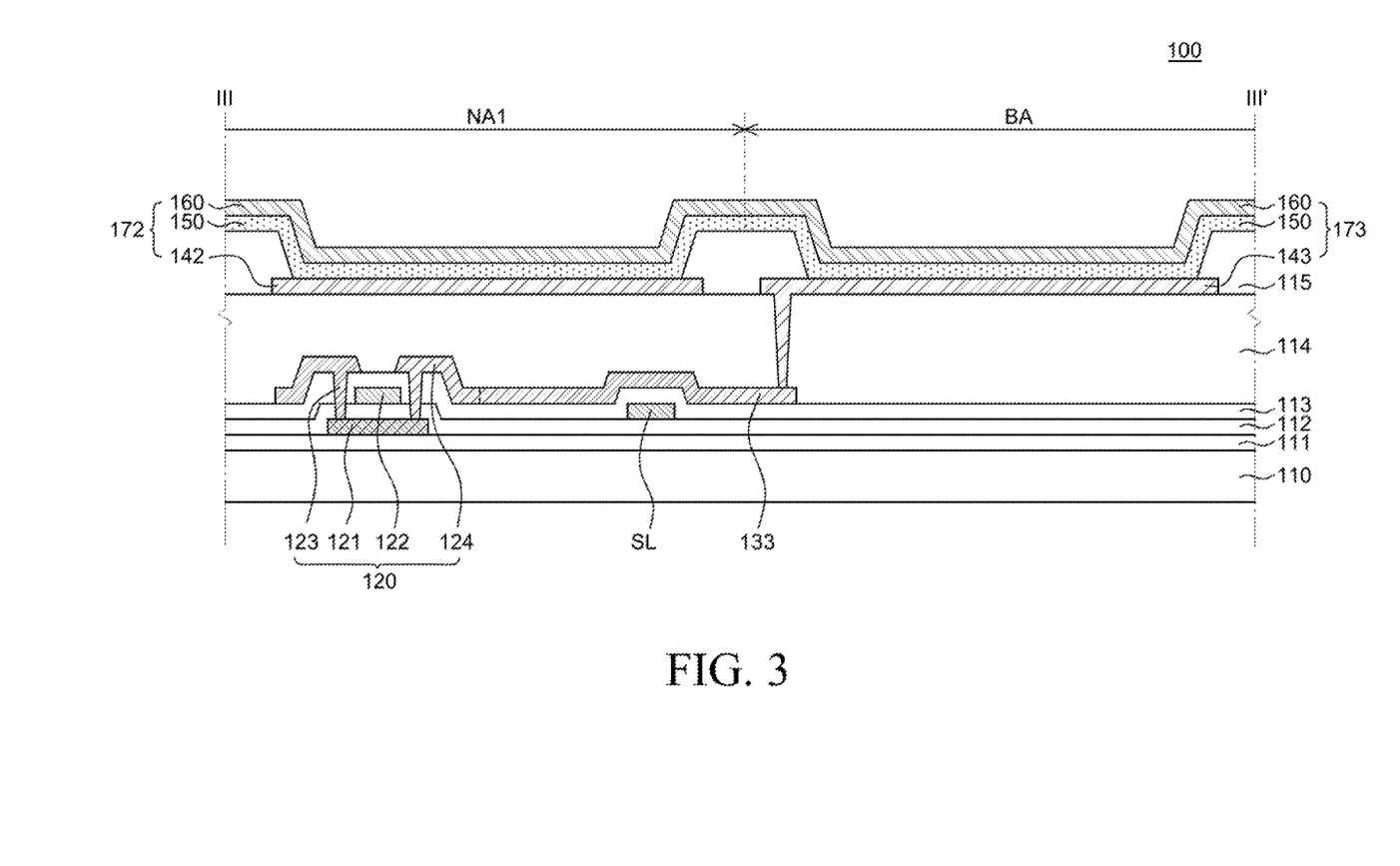
FIG. 3 is a cross-sectional view along a line III-III' of the organic light emitting display panel illustrated in FIG. 2.

FIG. 2 is an enlarged plan view of an area X of the organic light emitting display panel illustrated in FIG. 1, and FIG. 3 is a cross-sectional view along a line III-III' of the organic light emitting display panel illustrated in FIG. 2. FIG. 2 illustrates only a first pixel PX1 and a second pixel PX2 disposed in the first non-bending area NA1 and a third pixel PX3 and a fourth pixel PX4 disposed in the bending area BA from among the plurality of pixels PX for convenience in explanation. The area X is an area for eight pixels PX disposed adjacent to a boundary between the first non-bending area NA1 and the bending area BA in the active area AA.

As illustrated in FIG. 2, a plurality of lines are disposed on the flexible substrate 110. The plurality of lines include gate lines GL2, GL3, and GL4 extending in a first direction, for example, the X-axis direction, and data lines DL and Vdd lines VL extending in a second direction, for example, the Y-axis direction, on the flexible substrate 110. The gate lines GL2, GL3, and GL4 are configured to apply a gate signal to the pixel driving circuits PD, the data lines DL are configured to apply a data signal to the pixel driving circuits PD, and the Vdd lines VL are configured to apply a Vdd voltage to the pixel driving circuits PD. FIG. 2 illustrates only the gate lines GL2, GL3, and GL4, the data lines DL, and the Vdd lines Vdd for convenience of explanation. However, the present disclosure is not limited thereto, and additional lines may be disposed on the flexible substrate 110 depending on the kinds and numbers of a thin film transistor 120 and a capacitor constituting the pixel driving circuit PD, and a driving method of the organic light emitting element 170.

As illustrated in FIG. 2, the data lines DL and the Vdd lines VL extend in the Y-axis direction. Therefore, the data lines DL and the Vdd lines VL are disposed in both of the first non-bending area NA1 and the bending area BA. Further, although not illustrated in FIG. 2, the data lines DL and the Vdd lines VL also extend into the second non-bending area NA2 from the first non-bending area NA1 via the bending area BA. On the other hand, gate lines GL2, GL3, and GL4 extending in the X-axis direction are disposed only in the first non-bending area NA1, and are not disposed in the bending area BA. Further, although not illustrated in FIG. 2, a plurality of gate lines are also disposed in the second non-bending area NA2. The positions of the gate lines GL2, GL3, and GL4 will be described in detail with reference to the pixel driving circuits PD.

As illustrated in FIGS. 2 and 3, the plurality of pixel driving circuits PD are electrically connected to the plurality of organic light emitting elements 170 disposed in the plurality of pixels PX, and the plurality of pixel driving circuits PD are disposed on the flexible substrate 110. The plurality of pixel driving circuits PD are disposed only in the first non-bending area NA1 and the second non-bending area NA2 on the flexible substrate 110. The plurality of pixel driving circuits PD include various driving elements for driving the organic light emitting elements 170, and are electrically connected to the organic light emitting elements 170. The plurality of pixel driving circuits PD are disposed in the active area AA from among the bezel area ZA and the active area AA. Although FIG. 3 only includes a driving thin film transistor from among various driving elements of the pixel driving circuits PD for convenience of explanation, the present disclosure is not limited thereto, and the pixel driving circuits PD may include at least a switching thin film transistor, a driving thin film transistor, and a capacitor.

As illustrated in FIG. 3, the thin film transistor 120 serving as a driving thin film transistor is disposed on the flexible substrate 110. In more detail, a buffer layer 111 is formed on the flexible substrate 110 and an active layer 121 of the thin film transistor 120 is formed on the buffer layer 111. The buffer layer 111 is an insulation layer configured to protect the thin film transistor 120 against the infiltration of moisture or oxygen from the flexible substrate 110. The buffer layer 111 may be formed of silicon oxide SiOx or silicon nitride SiNx. The buffer layer 111 may be omitted depending on the structure or characteristics of the organic light emitting display panel 100. The active layer 121 is a semiconductor layer in which a channel area of the thin film transistor 120 is formed. The active layer 121 may be formed of, for example, poly silicon, amorphous silicon, and an oxide semiconductor. A gate electrode 122 is formed on the active layer 121, and a gate insulation layer 112 configured to insulate the active layer 121 and the gate electrode 122 is formed between the active layer 121 and the gate electrode 122. The gate insulation layer 112 may be formed of silicon oxide or silicon nitride, and the gate electrode 122 may be formed of a conductive material such as a metal material. An interlayer insulation layer 113 is formed on the gate electrode 122, and a source electrode 123 and a drain electrode 124 are formed on the interlayer insulation layer 113. The interlayer insulation layer 113 is configured to insulate the gate electrode 122 from the source electrode 123 and the drain electrode 124, and may be formed of silicon oxide or silicon nitride. The source electrode 123 and the drain electrode 124 are electrically connected to the active layer 121 through contact holes formed in the gate insulation layer 112 and the interlayer insulation layer 113. Further, the source electrode 123 and the drain electrode 124 may be formed of, for example, a metal material. Although, the think film transistor 120 illustrated in FIG. 3 has a coplanar structure, the present disclosure is not limited thereto and the thin film transistor 120 may have a staggered structure.

An overcoating layer 114 is disposed on the thin film transistor 120. The overcoating layer 114 functions to flatten an upper part of the flexible substrate 110. The overcoating layer 114 may be configured as a single layer or a plurality of layers, and may be formed of an organic material, for example, a polyimide or an acryl resin, but the present disclosure is not limited thereto.

As illustrated in FIG. 2, the plurality of organic light emitting elements 170 are disposed on the plurality of pixels PX, respectively. Thus, the plurality of organic light emitting elements 170 are disposed on the first non-bending area NA1, the second non-bending area NA2, and the bending area BA. For example, from among the plurality of pixels PX, a first organic light emitting element 171 is disposed on a first pixel PX1, a second organic light emitting element 172 is disposed on a second pixel PX2, a third organic light emitting element 173 is disposed on a third pixel PX3, and a fourth organic light emitting element 174 is disposed on a fourth pixel PX4. Each of the organic light emitting elements 171, 172, 173 and 174 includes an anode, an organic emission layer 150 on the anode, and a cathode 160 on the organic emission layer 150.

From among the plurality of organic light emitting elements 170, the second organic light emitting element 172 disposed in the first non-bending area NA1 and the third organic light emitting element 173 disposed in the bending area BA will be described in more detail with reference to FIG. 3. The second organic light emitting element 172 includes a second anode 142 on the overcoating layer 114, the organic emission layer 150 on the second anode 142, and the cathode 160 on the organic emission layer 150. Similarly, the third organic light emitting element 173 includes a third anode 143 on the overcoating layer 114, the organic emission layer 150 on the third anode 143, and the cathode 160 on the organic emission layer 150. Although not illustrated in FIG. 3, the first organic light emitting element 171 and the fourth organic light emitting element 174 may also be configured in the same manner as the second organic light emitting element 172 and the third organic light emitting element 173.

As illustrated in FIG. 3, the second anode 142 and the third anode 143 are disposed on the overcoating layer 114, and are configured to supply holes to the organic emission layer 150. The second anode 142 and the third anode 143 are electrically connected to the driving thin film transistors 120 of the second pixel driving circuit PD2 and the third pixel driving circuit PD3. The second anode 142 and the third anode 143 are disposed as being separated from each other on the overcoating layer 114, and may be formed of a transparent conductive material, for example, indium tin oxide (ITO) and indium zinc oxide (IZO).

The bank 115 is formed on the second anode 142, the third anode 143, and the overcoating layer 114. The bank 115 separates adjacent pixels PX. The bank 115 may be formed of an organic insulation material such as a polyimide, an acryl, or a benzocyclobutene-based resin, but the present disclosure is not limited thereto.

The organic emission layer 150 is disposed on the second anode 142, the third anode 143, and the bank 115. The organic emission layer 150 is an organic layer configured to emit light having a specific color, and may include a light emitting material capable of emitting, for example, red, green, blue or white light. The organic emission layer 150 of FIG. 3 is a continuous layer disposed on the second anode 142 and the third anode 143. However, the organic emission layer 150 is not limited thereto, and may be patterned on each pixel PX. Further, although omitted in FIG. 3, a color filter may be further included if the organic emission layer 150 emits white light, thereby converting white light emitted from the organic emission layer 150 into any one of red, green and blue lights. Further, although the organic emission layer 150 is the only organic layer illustrated in FIG. 3, the display panel may include other organic layers such as a hole injecting layer, a hole transporting layer, an electron transporting layer, and an electron injecting layer disposed between the second and third anodes 142 and 143 and the cathode 160.

The cathode 160 is disposed on the organic emission layer 150, and supplies electrons to the organic emission layer 150. Thus, the cathode 160 is formed of a conductive material having a low work function, such as a metal material such as magnesium (Mg) and a silver-magnesium (Ag:Mg) alloy.

The plurality of pixel driving circuits PD are disposed only on the first non-bending area NA1 and the second non-bending area NA2, and not in the bending area BA. In other words, the plurality of pixel driving circuits PD are disposed in an area overlapping with the active area AA of the first non-bending area NA1 and the second non-bending area NA2.

As illustrated in FIGS. 1 and 2, from among the plurality of organic light emitting elements 170 disposed in the bending area BA, a pixel driving circuit PD electrically connected to the organic light emitting element 170 adjacent to the first non-bending area NA1 rather than to the second non-bending area NA2 is disposed in the first non-bending area NA1. Further, although not illustrated in FIG. 2, from among the plurality of organic light emitting elements 170 disposed in the bending area BA, a pixel driving circuit PD electrically connected to the organic light emitting element 170 adjacent to the second non-bending area NA2 rather than to the first non-bending area NA1 is disposed in the second non-bending area NA2. For example, if n number of organic light emitting elements 170 are disposed in the bending area BA, pixel driving circuits PD electrically connected to n/2 number of organic light emitting elements 170 adjacent to the first non-bending area NA1 may be disposed in the first non-bending area NA1, and pixel driving circuits PD electrically connected to n/2 number of organic light emitting elements 170 adjacent to the second non-bending area NA2 may be disposed in the second non-bending area NA2. For example, as illustrated in FIG. 2, if the third pixel PX3 and the fourth pixel PX4 disposed in the bending area BA are adjacent to the first non-bending area NA1 rather than to the second non-bending area NA2, the third pixel driving circuit PD3 electrically connected to the third organic light emitting element 173 of the third pixel PX3 and the fourth pixel driving circuit PD4 electrically connected to the fourth organic light emitting element 174 of the fourth pixel PX4 are disposed in the first non-bending area NA1.

The gate lines GL2, GL3, and GL4 electrically connected to the pixel driving circuits PD may also be disposed only in the first non-bending area NA1 and the second non-bending area NA2 because all the pixel driving circuits PD are formed in the first non-bending area NA1 and the second non-bending area NA2. For example, a third gate line GL3 electrically connected to the third pixel driving circuit PD3 for driving the third organic light emitting element 173 disposed in the bending area BA and a fourth gate line GL4 electrically connected to the fourth pixel driving circuit PD4 for driving the fourth organic light emitting element 174 disposed in the bending area BA may be disposed in the first non-bending area NA1.

The organic light emitting elements 170 disposed in the bending area BA may be electrically connected to the pixel driving circuits PD disposed in the first non-bending area NA1 or the second non-bending area NA2 through connection lines 130. For example, as illustrated in FIGS. 2 and 3, the third anode 143 of the third organic light emitting element 173 disposed in the bending area BA is electrically connected to the third pixel driving circuit PD3 disposed in the first non-bending area NA1 through a third connection line 133 extending in the Y-axis direction. Further, an anode of the fourth organic light emitting element 174 disposed in the bending area BA may be electrically connected to the fourth pixel driving circuit PD4 disposed in the first non-bending area NA1 through a fourth connection line 134 extending in the Y-axis direction.

The connection line 130 may be formed of the same material as the source electrode 123 and the drain electrode 124 disposed in the pixel driving circuit PD. For example, as illustrated in FIG. 3, the third connection line 133 from among the connection lines 130 may extend from the drain electrode 124 of the thin film transistor 120 and formed at the same time as the source electrode 123 and the drain electrode 124. Although not illustrated, a first connection line 131, a second connection line 132, and the fourth connection line 134 may also be formed as one body with the drain electrode 124 of the thin film transistor 120, but the present disclosure is not limited thereto. The connection lines 130 may be formed as one body with the source electrode 123 of the thin film transistor 120, and may be formed of the same material as the gate electrode 122 of the thin film transistor 120. Furthermore, the connection line 130 may include a layer formed of the same material as the gate electrode 122 and another layer formed of the same material as the source electrode 123 and the drain electrode 124.

The organic light emitting elements 170 disposed in the bending area BA are electrically connected to the pixel driving circuits PD disposed in the first non-bending area NA1 or the second non-bending area NA2 through the connection lines 130. Thus, only one or more lines and one or more insulation layers can be disposed between the flexible substrate 110 and the organic light emitting elements 170 in the bending area BA. As illustrated in FIGS. 2 and 3, the third pixel driving circuit PD3 and the fourth pixel driving circuit PD4 electrically connected to the third organic light emitting element 173 and the fourth organic light emitting element 174, respectively, disposed in the bending area BA, are disposed in the first non-bending area NA1. Thus, only the data lines DL, the Vdd lines VL, and the connection lines 130 are disposed in the bending area BA, as illustrated in FIG. 2. Therefore, other conductive materials, other than the various lines, may not be formed between the flexible substrate 110 and the organic light emitting elements 170 in the bending area BA. Further, the insulation layers such as the buffer layer 111, the gate insulation layer 112, the interlayer insulation layer 113, and the overcoating layer 114 are generally formed on the entire surface of the flexible substrate 110. Therefore, the above-described insulation layers may be disposed between the flexible substrate 110 and the organic light emitting elements 170 in the bending area BA. Therefore, a structure between the flexible substrate 110 and the organic light emitting elements 171 and 172 on the first pixel PX1 and the second pixel PX2 disposed in the first non-bending area NA1 may be different from a structure between the flexible substrate 110 and the organic light emitting elements 173 and 174 on the third pixel PX3 and the fourth pixel PX4 disposed in the bending area BA. Likewise, a structure between the flexible substrate 110 and the organic light emitting elements 170 on the pixels PX disposed in the second non-bending area NA2 may be different from a structure between the flexible substrate 110 and the organic light emitting elements 170 on the pixels PX disposed in the bending area BA.

As described above, the pixel driving circuit PD electrically connected to the organic light emitting element 170 disposed in the bending area BA is disposed in the first non-bending area NA1 or the second non-bending area NA2. Thus, the number of organic light emitting elements 170 disposed in the first non-bending area NA1 and the second non-bending area NA2 is smaller than the number of pixel driving circuits PD disposed in the first non-bending area NA1 and the second non-bending area NA2. For example, m number of organic light emitting elements 170 may be disposed in each of the first non-bending area NA1 and the second non-bending area NA2 and n number of organic light emitting elements 170 may be disposed in the bending area BA. In such a case, the number of pixel driving circuits PD disposed in each of the first non-bending area NA1 and the second non-bending area NA2 may be m+(n/2).

Further, a plurality of pixel driving circuits PD may be disposed on one pixel PX in the first non-bending area NA1 and the second non-bending area NA2. That is, one organic light emitting element 170 may overlap with a plurality of pixel driving circuits PD in the first non-bending area NA1 and the second non-bending area NA2. As illustrated in FIG. 2, the third pixel driving circuit PD3 and the fourth pixel driving circuit PD4 for driving the third organic light emitting element 173 and the fourth organic light emitting element 174, respectively, which are disposed in the bending area BA may be disposed on the second pixel PX2 in the first non-bending area NA1. However, the number of pixel driving circuits PD disposed on one pixel PX in the first non-bending area NA1 and the second non-bending area NA2 is not limited thereto, and may be determined based on the size of the pixel PX and the size of the pixel driving circuits PD. For example, if the sum of the sizes of a specific number of pixel driving circuits PD is smaller than or equal to the size of one pixel PX, at most the specific number of pixel driving circuits PD may be disposed on the one pixel PX.

The pixel driving circuit PD electrically connected to the organic light emitting element 170 disposed in the bending area BA is disposed in the first non-bending area NA1 or the second non-bending area NA2. Thus, the pixel driving circuits PD for driving the organic light emitting elements 170 may be disposed in a different pixel from a pixel for the organic light emitting element 170. For example, as illustrated in FIG. 2, the third pixel driving circuit PD3 and the fourth pixel driving circuit PD4 for driving the third organic light emitting element 173 and the fourth organic light emitting element 174, respectively, which are disposed in the bending area BA, may be disposed on the second pixel PX2 disposed in the first non-bending area NA1 and the second pixel PX2 may not have sufficient space for an additional pixel driving circuit PD. In such a case, the second pixel driving circuit PD2 for driving the second organic light emitting element 172 on the second pixel PX2 may be disposed on the first pixel PX1 on an upper side relative to the second pixel PX2. The second anode 142 of the second organic light emitting element 172 may be electrically connected to the second pixel driving circuit PD2 through the second connection line 132, and the first organic light emitting element 171 on the first pixel PX1 may also be electrically connected to the first pixel driving circuit disposed on an upper pixel PX relative to the first pixel PX1 through the first connection line 131.

As further illustrated in FIG. 2, from among the organic light emitting display devices 170 disposed in the bending area BA, an organic light emitting element 170 farther from a boundary between the bending area BA and the first non-bending area NA1 is electrically connected to a pixel driving circuit PD closer to the boundary between the bending area BA and the first non-bending area NA1. For example, as illustrated in FIG. 2, the fourth organic light emitting element 174 may be farther from the boundary between the bending area BA and the first non-bending area NA1 than the third organic light emitting element 173. In this case, the fourth pixel driving circuit PD4 electrically connected to the fourth organic light emitting element 174 may be closer to the boundary between the bending area BA and the first non-bending area NA1 than the third pixel driving circuit PD3 electrically connected to the third organic light emitting element 173. Similarly, from among the organic light emitting display devices 170 disposed in the bending area BA, an organic light emitting element 170 farther from a boundary between the bending area BA and the second non-bending area NA2 may be electrically connected to a pixel driving circuit PD closer to the boundary between the bending area BA and the second non-bending area NA2.

From among the pixel driving circuits PD disposed in the first non-bending area NA1, more pixel driving circuits PD may be disposed in an area adjacent to the bending area BA. That is, the number of pixel driving circuits PD per unit area in the first non-bending area NA1 may decrease as the distance from the bending area BA increases. For example, if it is assumed that one pixel PX is a unit area, and the third pixel driving circuit PD3 and the fourth pixel driving circuit PD4 are disposed on the second pixel PX2, then only the second pixel driving circuit PD2 may be disposed on the first pixel PX1 farther from the bending area BA than the second pixel PX2, as illustrated in FIG. 2.

The pixel driving circuit PD disposed in the first non-bending area NA1 is electrically connected to the organic light emitting element 170 disposed in the bending area BA through the connection line 130. In such a case, as the length of the connection line 130 increases, the resistance value of the connection line 130 may also increase. Thus, it is desirable to set the length of the connection line 130 to be as short as possible, and to dispose the pixel driving circuit PD in the first non-bending area NA1 to be as close to the bending area BA as possible. As a result, the number of pixel driving circuits PD per unit area in the first non-bending area NA1 may decrease as a distance from the bending area BA increases. Although not illustrated in FIG. 2, the number of pixel driving circuits PD per unit area in the second non-bending area NA2 may also decrease as the distance from the bending area BA increases.

In the organic light emitting display panel 100 in which the bending area BA can be bent in a specific direction, elements disposed in the bending area BA are repeatedly subject to stress if the bending area BA is repeatedly bent. The stress generated when the bending area BA is bent by vertically moving at least one of the first non-bending area NA1 and the second non-bending area NA2 of the organic light emitting display panel 100 may cause various problems. For example, if the bending area BA is repeatedly bent while the thin film transistor 120 is disposed in the bending area BA, the source electrode 123 and the drain electrode 124 connected through the contact hole to the active layer 121 in which a channel area is formed may be easily cracked. Further, there the electrical contact between the active layer and the source and drain electrodes 123 and 124 may fail, or the characteristics of the interfaces between an electrode of the thin film transistor 120, an electrode of the capacitor, a line W, and the insulation layers laminated in the bending area BA may deteriorate. As a result, there may be a change in the threshold voltage or mobility of the thin film transistor 120 due to such problems, thereby deteriorating the electrical characteristics of the thin film transistor 120 and the characteristics of the organic light emitting element 170 electrically connected to the thin film transistor 120.

Thus, in the organic light emitting display panel 100, the pixel driving circuits PD, such as the thin film transistor 120 and the capacitor, for driving the organic light emitting elements 170 are disposed only in the first non-bending area NA1 and the second non-bending area NA2 of the active area, and not in the bending area BA. Thus, a driving element, such as the thin film transistor 120, is not disposed between the flexible substrate 110 and the organic light emitting elements 170 in the bending area BA, but only lines and insulation layers are disposed therein. Thus, where stress is applied to the bending area BA, damage to various elements, such as the thin film transistors 120 and the capacitors, included in the pixel driving circuits PD and present in the non-bending area NA1 and the non-bending area NA2 can be minimized, thereby improving the reliability of the organic light emitting display panel 100.

In the organic light emitting display panel 100, a pixel driving circuit PD electrically connected to an organic light emitting element 170 of the pixel PX disposed closer to the first non-bending area NA1 from among the plurality of organic light emitting elements 170 disposed in the bending area BA is disposed in the first non-bending area NA1. Further, a pixel driving circuit PD electrically connected to an organic light emitting element 170 of the pixel PX disposed closere to the second non-bending area NA2 from among the plurality of organic light emitting elements 170 disposed in the bending area BA is disposed in the second non-bending area NA2. Therefore, a concentration of the pixel driving circuits PD electrically connected to an organic light emitting elements 170 disposed in the bending area BA in a specific area of the first non-bending area NA1 or the second non-bending area NA2 can be reduced, and it may be easier to design and dispose the pixel driving circuits PD in the first non-bending area NA1 and the second non-bending area NA2.

The organic light emitting display panel 100 according to an exemplary embodiment of the present disclosure may be implemented as a top-emission organic light emitting display panel in which light from the organic emission layer 150 is emitted to an upper side through the cathode 160. As described above, a pixel driving circuit PD conventionally disposed in the bending area BA is moved to the first non-bending area NA1 and the second non-bending area NA2, and pixel driving circuits PD greater in number than pixels PX are disposed in the first non-bending area NA1 and the second non-bending area NA2. Therefore, if the organic light emitting display panel 100 is implemented as a bottom-emission organic light emitting display panel in which light from the organic emission layer 150 is emitted through the flexible substrate 110 on which the pixel driving circuits PD are disposed, an aperture ratio of the emission area may be reduced. Thus, the organic light emitting display panel 100 may be implemented as a top-emission organic light emitting display panel and sufficient space for the pixel driving circuits PD in the first non-bending area NA1 and the second non-bending area NA2 can be secured.

If the organic light emitting display panel 100 is a top-emission organic light emitting display panel, an anode of the organic light emitting element 170 may further include a reflective layer. For example, as illustrated in FIG. 3, the second anode 142 and the third anode 143 may further include reflective layers such that light emitted from the organic emission layer 150 can be reflected by the second anode 142 and the third anode 143, and be easily emitted toward an upper side. The second anode 142 and the third anode 143 may have a two-layer structure in which a transparent conductive layer formed of a transparent conductive material and a reflective layer are laminated in sequence. Alternatively, the second anode 142 and the third anode 143 may have a three-layer structure in which a transparent conductive layer, a reflective layer, and a transparent conductive layer are laminated in sequence. However, the present disclosure is not limited thereto. The reflective layer may be formed of silver (Ag) or an alloy including silver. For example, the reflective layer may be formed of silver or APC (Ag/Pd/Cu). Further, if the organic light emitting display panel 100 is a top-emission organic light emitting display panel, the cathode 160 may be formed of the same material as the above-described material of the second anode 142 and the third anode 143, and may have a small thickness. Alternatively, the cathode 160 may be formed of transparent conductive oxide such as indium tin oxide and indium zinc oxide.

Although, as illustrated in FIG. 1, the flexible substrate 110 includes only the two non-bending areas NA1 and NA2 and the one bending area BA between the two non-bending areas NA1 and NA2, the number of non-bending areas and the number of bending areas of the flexible substrate 110 are not limited thereto. There may be two non-bending areas NA1 and NA2 as illustrated in FIG. 1, or there may be three non-bending areas and two bending areas BA between the non-bending areas, or there may be four or more non-bending areas, and the like.

Further, although, as illustrated in FIG. 1, the bending area BA of the flexible substrate 110 extends in a direction parallel to the X-axis direction, the extension direction of the bending area BA is not limited thereto, and the bending area BA may extend in various directions.

Figure 4:
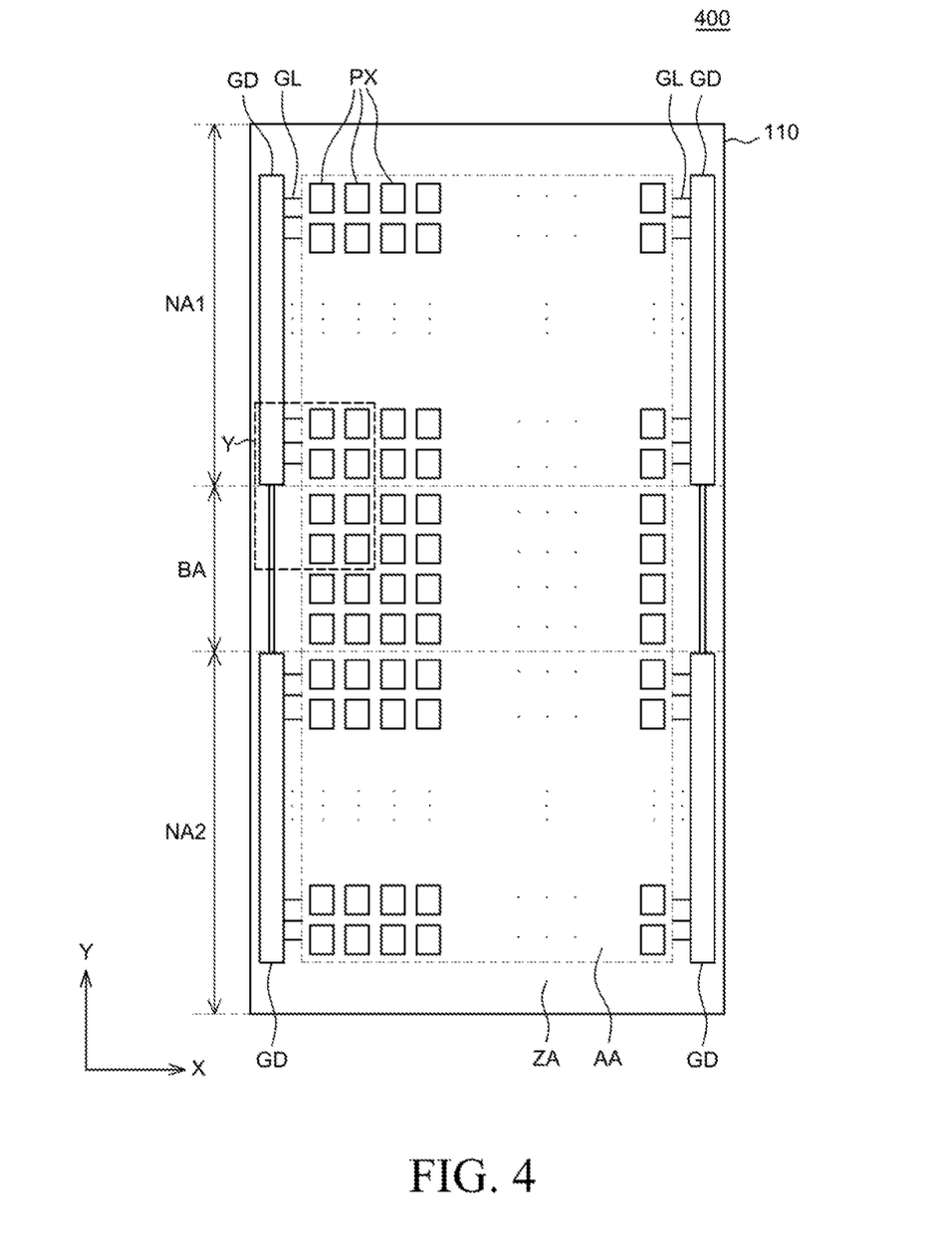
FIG. 4 is a plan view of an organic light emitting display panel according to another exemplary embodiment of the present disclosure.
Figure 5:
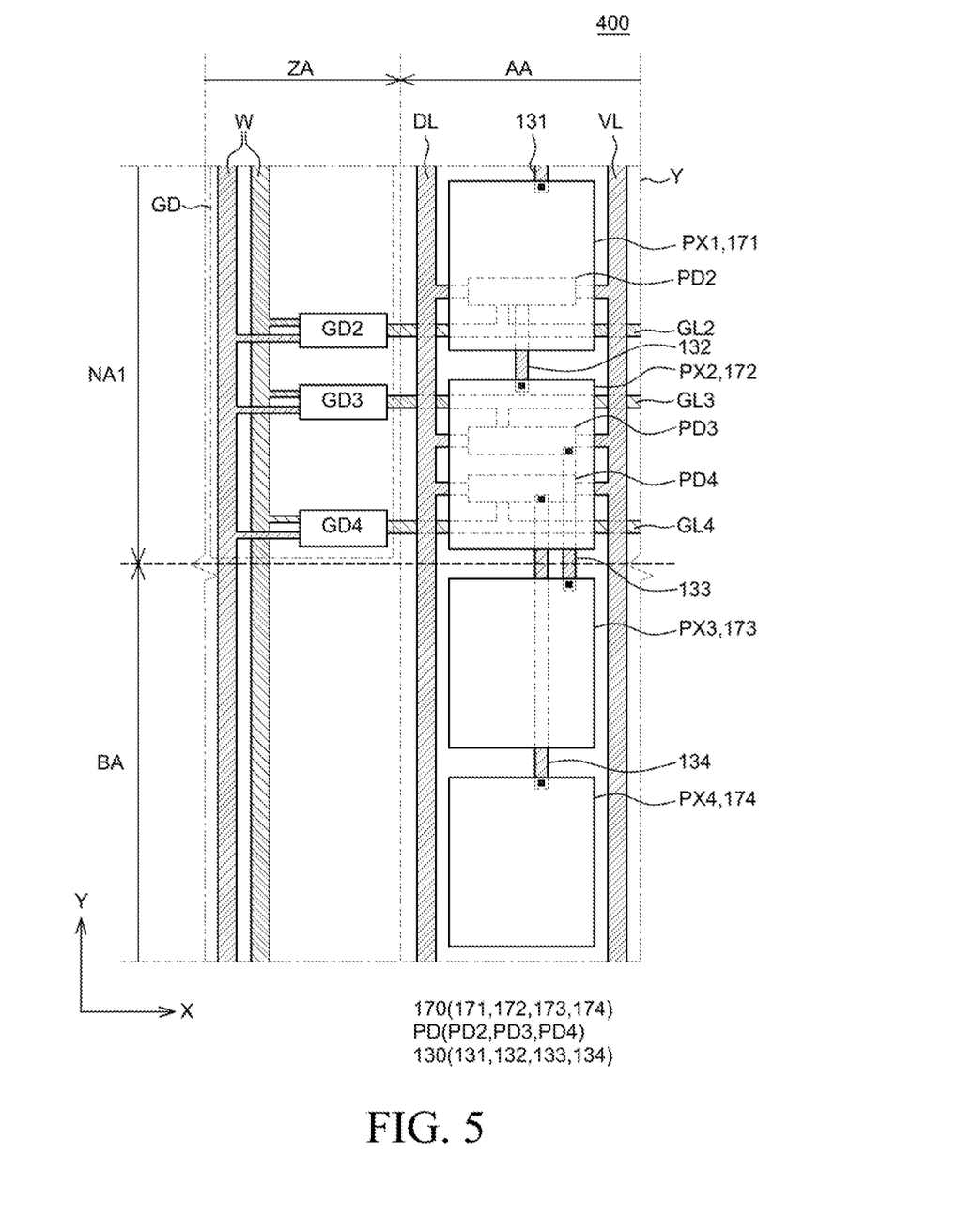
FIG. 5 is an enlarged plan view of an area Y of the organic light emitting display panel illustrated in FIG. 4.

FIG. 4 is a plan view of an organic light emitting display panel according to another exemplary embodiment of the present disclosure, and FIG. 5 is an enlarged plan view of the area Y of the organic light emitting display panel illustrated in FIG. 4. The organic light emitting display panel 400 illustrated in FIGS. 4 and 5 are substantially the same as the organic light emitting display panel 100 illustrated in FIGS. 1 to 3, except that gate driving circuits GD are further included. Thus, redundant explanations thereof will be omitted.

As illustrated in FIG. 4, the gate driving circuits GD are disposed in the bezel area ZA of the flexible substrate 110. The gate driving circuits GD are configured to apply a gate signal to each of the pixel driving circuits PD through the gate lines GL. The gate driving circuits GD can be referred to as GIP (Gate In Panel) circuits, because the gate driving circuits GD are directly formed on the flexible substrate 110. As illustrated in FIG. 4, the gate driving circuits GD are respectively disposed in the bezel area ZA on both sides of the active area AA. However, the present disclosure is not limited thereto, and the gate driving circuits GD may be disposed in the bezel area ZA on only one side of the active area AA.

As illustrated in FIG. 5, the gate driving circuits GD may include a fourth gate driving circuit GD4 configured to apply a gate signal to the fourth pixel driving circuit PD4, a third gate driving circuit GD3 configured to apply a gate signal to the third pixel driving circuit PD3, and a second gate driving circuit GD2 configured to apply a gate signal to the second pixel driving circuit PD2. Although not illustrated in FIG. 5, a first gate driving circuit GD1 configured to apply a gate signal to the first pixel driving circuit PD1 may be further included therein. Each of the second gate driving circuit GD2, the third gate driving circuit GD3, and the fourth gate driving circuit GD4 may include various elements such as a thin film transistor and a capacitor. Further, lines W for transferring various signals within the gate driving circuit GD may be disposed therein.

The gate driving circuits GD are disposed only in the first non-bending area NA1 and the second non-bending area NA2 of the bezel area ZA, and are not disposed in the bending area BA. For example, as illustrated in FIG. 5, the second gate driving circuit GD2, the third gate driving circuit GD3, and the fourth gate driving circuit GD4 are all disposed in the first non-bending area NA1. Further, all of the thin film transistors and the capacitors of the respective gate driving circuits GD are disposed in the first non-bending area NA1. Although not illustrated in FIG. 5, the gate driving circuits GD may also be disposed in the second non-bending area NA2 in the same manner as those in the first non-bending area NA1. The lines W need to be connected to all of the gate driving circuits GD disposed in the first non-bending area NA1 and the gate driving circuits GD disposed in the second non-bending area NA2, and thus, the lines W may be disposed in the bezel area ZA.

As described above, the gate driving circuits GD are disposed only in the first non-bending area NA1 and the second non-bending area NA2 of the bezel area ZA. Thus, each of the gate driving circuits GD and the plurality of gate lines GL2, GL3, and GL4 connecting each of the pixel driving circuits PD are also disposed only in the first non-bending area NA1 and the second non-bending area NA2. For example, as illustrated in FIG. 5, the second gate driving circuit GD2 and the second gate line GL2 connecting the second pixel driving circuit PD2, the third gate driving circuit GD3 and the third gate line GL3 connecting the third pixel driving circuit PD3, and the fourth gate driving circuit GD4 and the fourth gate line GL4 connecting the fourth pixel driving circuit PD4 are all disposed in the first non-bending area NA1 and are not disposed in the bending area BA.

In the organic light emitting display panel 400, if the bending area BA is repeatedly bent, stress is repeatedly applied to elements disposed in the bending area BA. Cracks caused by the stress generated during bending may easily occur in the bezel area ZA, which is an outer peripheral area of the organic light emitting display panel 400. Further, cracks occurring in conductive layers or insulation layers in the bezel area ZA can be propagated to other elements disposed in the active area AA. Therefore, it is very important to suppress the occurrence of cracks in the bezel area ZA when the bending area BA is bent.

Thus, in the organic light emitting display panel 400 according to another exemplary embodiment of the present disclosure, the gate driving circuits GD, such as thin film transistors and capacitors, for supplying gate signals through the gate lines GL2, GL3, and GL4 are disposed only in the first non-bending area NA1 and the second non-bending area NA2, and not in the bending area BA, thereby minimizing stress to the elements, such as the thin film transistors and the capacitors, included in the gate driving circuits GD when the bending area BA is repeatedly bent. Thus, deterioration of the device characteristics of the driving elements included in the gate driving circuits GD may be reduced or prevented. Further, the gate driving circuits GD, which may be cracked due to the stress generated when the bending area BA is bent, are disposed in the first non-bending area NA1 or the second non-bending area NA2 of the bezel area ZA of the organic light emitting display panel 400. Therefore, occurrence of cracks in the bezel area ZA overlapping with the bending area BA may be reduced when the bending area BA is bent. Further, propagation of cracks occurring in the bezel area ZA to the active area AA may also be reduced.

Figure 6:
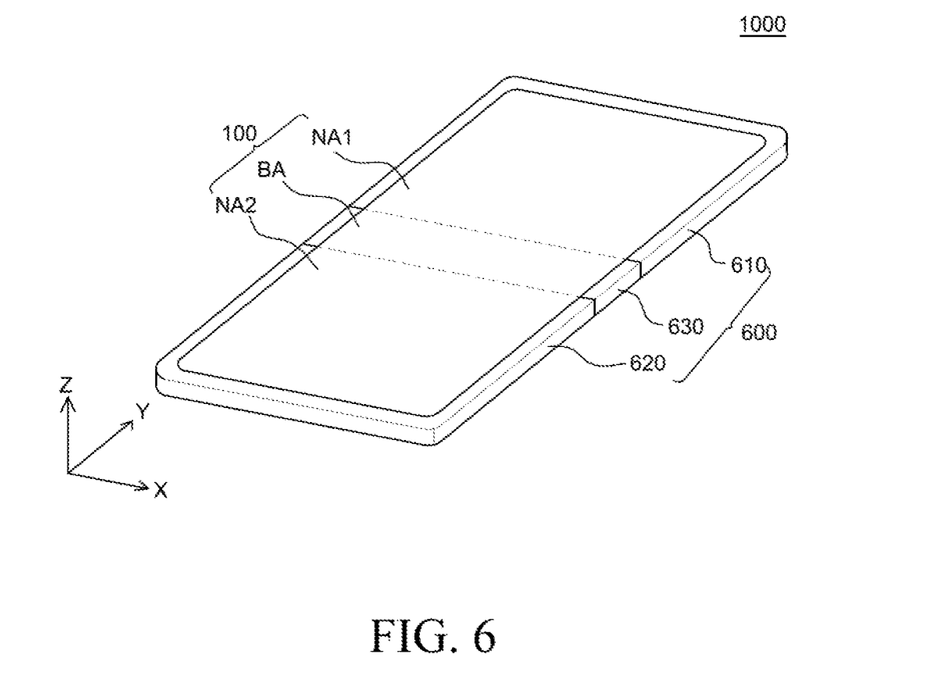
FIG. 6 and FIG. 7 are perspective views of an organic light emitting display device according to an exemplary embodiment of the present disclosure.
Figure 7:
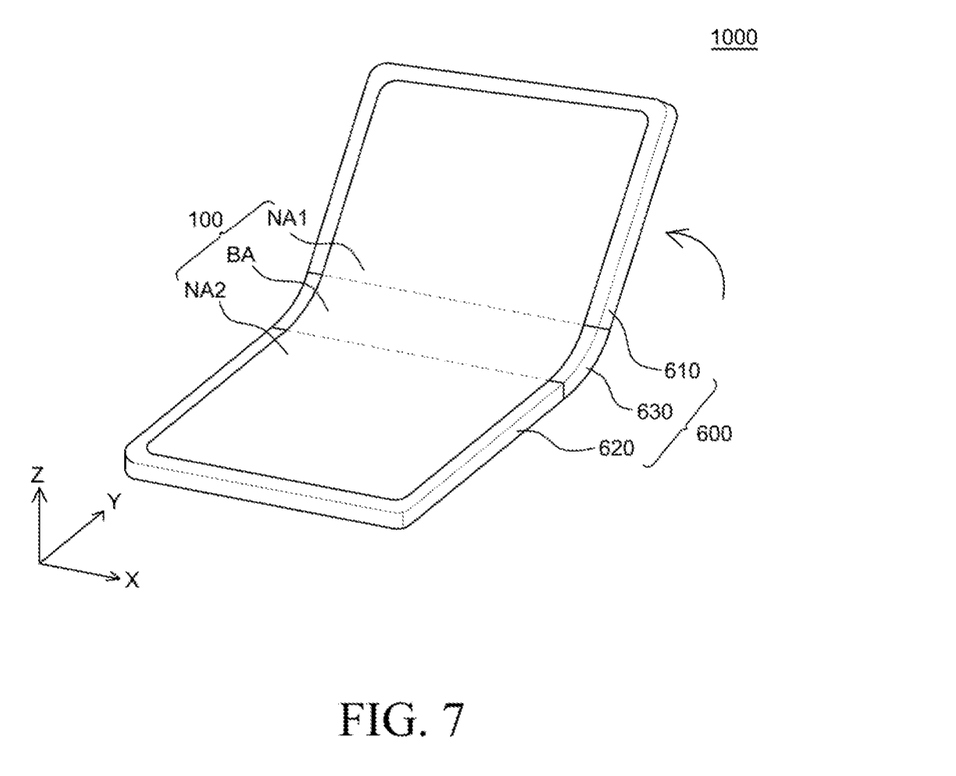

FIGS. 6 and 7 are perspective views of an organic light emitting display device according to an exemplary embodiment of the present disclosure. An organic light emitting display device 1000 illustrated in FIG. 6 is an organic light emitting display device to which the organic light emitting display panel 100 illustrated in FIGS. 1 to 3 is applied, and redundant descriptions thereof will be omitted. However, the present disclosure is not limited thereto, and the organic light emitting display device 1000 may include the organic light emitting display panel 400 illustrated in FIGS. 4 and 5. FIG. 7 illustrates a case where the organic light emitting display device 1000 is bent.

As illustrated in FIG. 6, the organic light emitting display device 1000 includes a case 600 and the organic light emitting display panel 100.

The case 600 includes a first case 610, a second case 620, and a bending member 630 disposed between the first case 610 and the second case 620 and connecting the first case 610 and the second case 620. The first case 610 surrounds the first non-bending area NA1 of the organic light emitting display panel 100, and covers a part of an upper surface, a lateral surface, and a lower surface of the organic light emitting display panel 100 corresponding to the first non-bending area NA1. The second case 620 surrounds the second non-bending area NA2 of the organic light emitting display panel 100, and covers a part of an upper surface, a lateral surface, and a lower surface of the organic light emitting display panel 100 corresponding to the second non-bending area NA2. However, the shapes of the first case 610, the second case 620, and the bending member 630 are not limited thereto.

The bending member 630 is disposed between the first case 610 and the second case 620, and mechanically connects the first case 610 to the second case 620. The bending member 630 covers a part of an upper surface, a lateral surface, and a lower surface of the organic light emitting display panel 100 corresponding to the bending area BA. The bending member 630 may be formed to have a mechanical structure, for example, such as a hinge structure, and the organic light emitting display panel 100 may be bent by the hinge structure of the bending member 630. Alternatively, the bending member 630 may be formed of a material having flexibility, and the organic light emitting display panel 100 may be bent by directly bending the bending member 630. Thus, the bending area BA of the organic light emitting display panel 100 may be defined as an area of the organic light emitting display panel 100 surrounded by the bending member 630.

Although FIG. 6 illustrates the first case 610, the second case 620, and the bending member 630 as being separately formed, the present disclosure is not limited thereto, and the first case 610, the second case 620, and the bending member 630 may be formed as one body.

As illustrated in FIG. 7, the organic light emitting display device 1000 may be configured to be bendable in one direction. That is, if a part of the organic light emitting display panel 100 surrounded by the first case 610 is moved in a Z-axis direction, the bending member 630 is bent, so that a part of the organic light emitting display panel 100 surrounded by the bending member 630 can be bent. Further, although not illustrated in FIG. 7, if a part of the organic light emitting display panel 100 surrounded by the second case 620 is moved in the Z-axis direction, the bending member 630 is bent, so that the part of the organic light emitting display panel 100 surrounded by the bending member 630 can be bent.

As described above, if the part of the organic light emitting display panel 100 surrounded by the bending member 630 is bent, stress is applied to the elements disposed in the bent part of the organic light emitting display panel 100. However, the parts of the organic light emitting display panel 100 surrounded by the first case 610 or the second case 620 remain in a flat state. Thus, even if the organic light emitting display device 1000 is bent, stress is not applied to the parts of the organic light emitting display panel 100 surrounded by the first case 610 or the second case 620. Therefore, stress is not applied to the elements, such as thin film transistors or capacitors, disposed on the organic light emitting display panel 100 surrounded by the first case 610 or the second case 620, thereby reducing damage thereto.

Thus, in the organic light emitting display device 1000 according to an exemplary embodiment of the present disclosure, pixel driving circuits electrically connected to organic light emitting elements disposed in the part of the organic light emitting display panel 100 surrounded by the bending member 630 from among a plurality of organic light emitting elements are disposed in the part of the organic light emitting display panel 100 surrounded by the first case 610 or the second case 620. Further, the organic light emitting display device 1000 may further include the gate driving circuits of the organic light emitting display panel 100 illustrated in FIGS. 4 and 5. In such a case, the thin film transistors and the capacitors of the gate driving circuits for applying a gate signal to the pixel driving circuits are also disposed in the part of the organic light emitting display panel 100 surrounded by the first case 610 or the second case 620. Therefore, in case of bending the bending area BA of the organic light emitting display device 1000, stress applied to the elements, such as the thin film transistors and the capacitors, included in the pixel driving circuits or the gate driving circuits may be minimized. Further, deterioration in the electrical characteristics of the driving elements can also be minimized, thereby improving the reliability of the organic light emitting display device 1000.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only and are not intended to limit the technical concept of the present disclosure. The protective scope of the present disclosure should be construed based on any appended claims and combinations thereof, and all the technical concepts in the equivalent scope thereof should be construed as falling within the scope of the present disclosure.

What is claimed is:

1. An organic light emitting display panel comprising:
    a flexible substrate including a first non-bending area, a second non-bending area and a bending area between the first non-bending area and the second non-bending area;
    a plurality of organic light emitting elements disposed in the first non-bending area, the second non-bending area and the bending area, wherein each of the plurality of organic light emitting elements includes an anode, an organic emission layer, and a cathode; and
    a plurality of pixel driving circuits in the first non-bending area and the second non-bending area,
    wherein the plurality of pixel driving circuits are electrically connected to the plurality of organic light emitting elements, respectively,
    wherein the flexible substrate includes an active area and a bezel area,
    wherein the active area includes the plurality of organic light emitting elements and the plurality of pixel driving circuits,
    wherein the bezel area comprises a gate driving circuit,
    wherein the gate driving circuit includes a thin film transistor and a capacitor,
    wherein each of the plurality of pixel driving circuits includes a switching thin film transistor, a capacitor and a driving thin film transistor electrically connected to the organic light emitting element.

2. The organic light emitting display panel according to claim 1, wherein the thin film transistor and the capacitor of the gate driving circuit are disposed in the first non-bending area and the second non-bending area overlapping with the active area.

3. The organic light emitting display panel according to claim 1, further comprising:
    a plurality of gate lines connecting the gate driving circuit and the plurality of pixel driving circuits,
    wherein the plurality of gate lines is disposed in the first non-bending area and the second non-bending area.

4. The organic light emitting display panel according to claim 1, wherein the number of the organic light emitting elements in the first non-bending area and the second non-bending area is smaller than the number of the pixel driving circuits in the first non-bending area and the second non-bending area.

5. The organic light emitting display panel according to claim 1, wherein the number of the pixel driving circuits per unit area in the first non-bending area and the number of the pixel driving circuits per unit area in the second non-bending area decreases as a distance from the bending area increases.

6. The organic light emitting display panel according to claim 1, further comprising:
    a connection line connecting the anode of the organic light emitting element in the bending area and the pixel driving circuit in the first non-bending area or the second non-bending area,
    wherein the connection line comprises a material, which is the same as a material of one of a source electrode, a drain electrode and a gate electrode disposed on the pixel driving circuit.

7. The organic light emitting display panel according to claim 6, wherein the connection line is an extension of one of the source electrode and the drain electrode.

8. The organic light emitting display panel according to claim 1, wherein one or more lines and one or more insulation layers are disposed between the flexible substrate and the organic light emitting elements in the bending area.

9. The organic light emitting display panel according to claim 1, wherein the anode includes a reflective layer comprising a metal material and a transparent conductive layer comprising a transparent conductive material, wherein the transparent conductive layer is on the reflective layer.

10. An organic light emitting display device comprising:
    a case including a first case, a second case, and a bending member connecting the first case and the second case; and
    an organic light emitting display panel surrounded by the case, and including a plurality of organic light emitting elements and a plurality of pixel driving circuits electrically connected to the plurality of organic light emitting elements, respectively,
    wherein the plurality of pixel driving circuits are disposed in a part of the organic light emitting display panel surrounded by the first case and the second case.

11. The organic light emitting display device according to claim 10, further comprising:
    a gate driving circuit including a thin film transistor and a capacitor,
    wherein the thin film transistor and the capacitor are disposed in the part of the organic light emitting display panel surrounded by the first case and the second case.

12. The organic light emitting display device according to claim 10, wherein the bending member bends the organic light emitting display device in one direction.

13. An organic light emitting display panel comprising:
    a flexible substrate including a first non-bending area, a second non-bending area and a bending area between the first non-bending area and the second non-bending area;
    a plurality of organic light emitting elements disposed in the first non-bending area, the second non-bending area and the bending area, wherein each of the plurality of organic light emitting elements includes an anode, an organic emission layer, and a cathode; and a plurality of pixel driving circuits in the first non-bending area and the second non-bending area, wherein the plurality of pixel driving circuits are electrically connected to the plurality of organic light emitting elements, respectively, wherein the number of the organic light emitting elements in the first non-bending area and the second non-bending area is smaller than the number of the pixel driving circuits in at least one of the first non-bending area and the second non-bending area.

14. The organic light emitting display panel according to claim 13, wherein the number of the pixel driving circuits per unit area in the first non-bending area and the number of the pixel driving circuits per unit area in the second non-bending area decreases as a distance from the bending area increases.

15. The organic light emitting display panel according to claim 13, wherein each of the plurality driving circuits includes a switching thin film transistor or a capacitor.

* * * * *